United States Patent [19]

Uno et al.

[11] Patent Number: 5,658,664
[45] Date of Patent: Aug. 19, 1997

[54] THIN GOLD-ALLOY WIRE FOR SEMICONDUCTOR DEVICE

[75] Inventors: Tomohiro Uno; Osamu Kitamura; Yasuhide Ohno, all of Kawasaki, Japan

[73] Assignee: Nippon Steel Corporation, Tokyo, Japan

[21] Appl. No.: 652,202

[22] Filed: May 23, 1996

Related U.S. Application Data

[63] Continuation of Ser. No. 351,384, filed as PCT/JP94/00599, Apr. 8, 1994, published as WO94/24322, Oct. 27, 1994, abandoned.

[30] Foreign Application Priority Data

Apr. 8, 1993 [JP] Japan ................... 5-082254

[51] Int. Cl.$^6$ ............... C22C 28/00; C22C 5/02
[52] U.S. Cl. ............... 428/364; 428/606; 428/620; 420/507
[58] Field of Search ............... 428/606, 620, 428/364; 420/555, 558, 511, 507

[56] References Cited

FOREIGN PATENT DOCUMENTS

| | | |
|---|---|---|
| 58-96741 | 6/1983 | Japan . |
| 61-172343 | 8/1986 | Japan . |
| 61-296731 | 12/1986 | Japan . |
| 63-145729 | 6/1988 | Japan . |
| 2-215140 | 8/1990 | Japan . |
| 2-260643 | 10/1990 | Japan . |

OTHER PUBLICATIONS

JP63-145729, Taneda et al. English translation Jun. 1988.

*Primary Examiner*—Kathleen Choi
*Attorney, Agent, or Firm*—Kenyon & Kenyon

[57] ABSTRACT

This invention provides a thin gold-alloy wire for a semiconductor device capable of improving long term reliability of bonding with an electrode and capable of simultaneously accomplishing reduction of a wire bend and wire flow at the time of resin molding and high looping.

The thin gold-alloy wire contains 50 to 3000 ppm by weight of Mn and the balance comprising gold and unavoidable impurities. Further, the thin gold-alloy wire comprises any of the following combinations ①, ②, ①+②, ②+③ and ①+②+③ when element groups to be added are classified into the following groups ① to ③:

① 1 to 20 ppm by weight in total of at least one of Be and B;

② 1 to 30 ppm by weight in total of at least one of Ca, Sr and rare earth elements; and ③ 1 to 50 ppm by weight in total of at least one of In and Tl.

The thin gold-alloy wire according to the present invention has high bonding reliability at the bond portion with the electrode on a semiconductor device and can be packaged with high density semiconductor devices.

1 Claim, 1 Drawing Sheet

1

THIN GOLD-ALLOY WIRE FOR SEMICONDUCTOR DEVICE

This application is a continuation of application Ser. No. 08/351,384, filed as PCT/JP94/00599, Apr. 8, 1994, published as WO94/24322, Oct. 27, 1994, now abandoned.

TECHNICAL FIELD

This invention relates to a thin gold-alloy wire having high bonding reliability, which is used for connecting an electrode on a semiconductor device to an external lead.

BACKGROUND ART

A thin gold-alloy wire has been mainly used as a bonding wire for bonding electrodes on a semiconductor device to external leads. An ultrasonic wave-thermal pressing combination system has been employed generally as bonding technology of the thin gold-alloy wire. Namely, the distal end of the thin gold-alloy wire is heated and molten by arc heat input to form a ball by a surface tension. After this ball is press-bonded to an electrode of a semiconductor device heated to a temperature within the range of 150° to 300° C., it is connected to an external lead by ultrasonic pressing.

To use semiconductor devices such as transistors, ICs, etc., as the product, a Si chip, bonding wires, and the portions of a lead frame to which the Si chip is fitted, are resin-molded for protection after bonding the thin gold-alloy wire as described above.

The characteristics which the thin gold-alloy wire is required to possess have become diversified with the higher integration density of semiconductor devices and the reduction of their thickness. To cope with high density wiring and narrow pitches, for example, the thin gold-alloy wire must be thin or must be capable of high looping, and in order to reduce the thickness of the semiconductor device, the thin gold-alloy wire must be capable of low looping. To satisfy elongation of the wire, the reduction of the wire diameter and adjustment of the loop height described above, thin gold-alloy wires containing several kinds of elements as the additional elements have been developed, as described, for example, in Japanese Unexamined Patent Publication (Kokai) Nos. 61-296731 and 61-172343.

Recently, the environmental condition for the use of semiconductor devices has become more severe. For example, semiconductor devices used inside the engine compartment of an automobile are exposed to high temperatures, e.g., a temperature range of 150° to 200° C., or high humidity. The heat generated at the time of use of semiconductor devices due to their high density packaging cannot be neglected. When a thin gold-alloy wire is used, the drop of long term reliability of the bond with an aluminum electrode has become a problem.

In semiconductor devices used under an environmental condition where heat-resistance is a requisite, a thin aluminum-alloy wire has been used in the past as a bonding wire, and a ceramic package semiconductor device has been utilized. The thin aluminum-alloy wire has the advantage that high reliability can be obtained at the bond with an electrode on a semiconductor device due to bonding the same kind of metal. However, the ceramic package is more expensive than a resin molding. In addition, it is difficult to form a normal ball in air by the use of the thin aluminum-alloy wire. Accordingly, a wedge bonding method has generally been employed as the bonding method, and producibility drops in comparison with the thin gold-alloy wire.

Therefore, the use of the thin aluminum-alloy wire has been limited to specific semiconductors from the aspects of the production cost, producibility, and so forth, and the bonding system using the thin gold-alloy wire, which has an excellent operation factor, a high producibility and a high workability, is expected to be predominate in future.

The problem of the drop of long term reliability of the bond with the aluminum electrode on the semiconductor device has existed when the conventional thin gold-alloy wire is used at elevated temperature environment, e.g., a temperature range of 50° to 200° C. In other words, aluminum as the electrode material and gold undergo mutual diffusion and form intermetallic compounds and generate voids, so that peel and electrical conduction defects occur at the bond.

In order to control the growth of intermetallic compounds, a technique which adds Mn into a thin gold-alloy wire is described in Japanese Unexamined Patent Publication (Kokai) No. 2-215149.

Under such circumstances, a thin gold-alloy wire having high bonding reliability with the aluminum electrode in a high temperature environment has been required.

DISCLOSURE OF THE INVENTION

As a result of a series of studies on bonding reliability, the inventors of the present invention have confirmed that contrary to common sense in the prior art, the growth of intermetallic compounds increases strength in an interface of a bond portion but that when the bond portion of a resin-molded semiconductor device is held at a high temperature, the intermetallic compounds are corroded with halogen components in the molding resin.

Moreover, as a result of studying the above bond portion in detail, the inventors of the present invention defined that almost all the intermetallic compounds formed in the bond portion are $Au_5Al_2$ phase and these compounds transform into $Au_4Al$ phase, in accordance with the progress of diffusion of Au and Al. BY reacting the $Au_4Al$ phase with halogen components contained in the molding resin, corrosion easily occurs and electrical resistance of the bond portion increases by this reaction. When this corrosion is remarkable, electrical conduction defects occur.

From the above studies, the present inventors defined that in many compounds of an Au-Ag system, the only compound which may be corroded is the above $Au_4Al$ phase.

As a result, in order to obtain the bond strength at a high temperature, it is necessary to positively form the intermetallic compounds and to grow $Al_5Al_2$ phase and to avoid transformation into $Au_4Al$ phase which is a corroded phase.

The inventors of the present invention have carried out their studies in search of a thin gold-alloy wire which can improve the bonding reliability at high temperatures from the viewpoint described above, and have acquired the following technical concept.

(a) When Mn of 30 to 3000 ppm by weight is added to Au, corrosion of the intermetallic compound layer at the resin-molded bond portion, in a high temperature atmosphere can be remarkably reduced. Namely, the addition of Mn suppresses the transformation of $Au_5Al_2$ phase into $Au_4Al$ phase, in the intermetallic compound. For example, a bonded portion of a thin gold-alloy wire obtaining 1000 ppm by weight of Mn and an aluminum electrode was resin-molded, the bonded portion was heated to a temperature of 200° C. for 300 hr and X-ray diffraction was carried out on the obtained material. The results of the X-ray diffraction were indicated in FIG. 1. The only compound confirmed in FIG. 1 was $Au_5Al_2$.

When the above heating condition is carried out on the conventional thin gold-alloy wire, a translation into $Au_4Au$ phase from $Au_5Al_2$ phase takes place and corrosion occurs. However, in the thin gold alloy wire containing Mn, as shown in FIG. 1, the phase-transformation to $Au_4Al$ phase is suppressed and corrosion cannot be observed.

Also, in the case of containing a range of minute amount of less than 100 ppm by weight of Mn, few $Au_4Al$ phases were formed but corrosion was sufficiently suppressed and there was no problem in practical use. Moreover, there was an effect that sphericity of the ball portion formed at the distal end of the wire could be improved. Three kinds of thin gold alloy wire which each contained 0.1% (1000 ppm) of Mn, 0.001% (100 ppm) of Mn or 0% of Mn were set and bonded and then bonded portions were resin-molded, and as a result, the semiconductor device obtained was annealed at a temperature of 200° C. for 300 hrs and 1000 hr. Next, the electric resistance was examined for each of the thin wires, and the results are shown in FIG. 2.

The electric resistance increases a corrosion proceeds.

In the thin wire containing 100 ppm of Mn, the electric resistance increased slightly after the annealing was carried out for 300 hrs but this increase was no problem. Also, even if this thin wire was held at a temperature of 200° C. for 1,000 hrs, the electric resistance was about less than half of that of the thin wire containing no Mn. Therefore, as shown in FIG. 2, the wire containing 100 ppm of Mn has an excellent corrosion resistance at a high temperature.

Further, in this figure, when the thin wire containing 1000 ppm of Mn was annealed at a temperature of 200° C. for 300 hrs, the electric resistance of the obtained thin wire was little better than that of a material before annealing.

The above description shows that the results of FIG. 1 are correct.

As described above, in the present invention, since the feature of the present invention is to suppress translation of from $Au_5Al_2$ phase to $Au_4Au$ phase, corrosion of a bonded portion can be prevented and bonding strength can be increased and therefore the present invention has a significant effect.

To attain elongation of the wire and to control the loop shape and its loop height, the inventors have furthered their studies and have found out that when the elements of the following first to third groups are co-present in addition to the mere addition of the Mn element, the following effects can be obtained.
(b) When 1 to 20 ppm by weight of at least one member selected from the group consisting of Be and B (first group), in total, is added, the normal temperature strength of the wire can be improved. Accordingly, drawing can be made easier in comparison with the gold alloy to which the Mn element is alone added.
(c) When 1 to 30 ppm by weight of at least one of Ca, Sr and rare earth elements including Y (second group), in total, is added, the mechanical characteristics of the wire, particularly its high temperature strength, can be improved, and coarsening of crystal grains at heat-affected portions in the proximity of the ball portion can be restricted, so that the strength of the neck portion near the ball portion can be increased.
(d) When the elements of the first and second groups are co-present, the mechanical strength of the wire can be improved and a linear property of the wire after bonding can also be improved (reduction of bending of the wire). In consequence, the thin gold-alloy wire can cope with a long span having a large bonding distance. Further, since the high temperature strength increases with an increase in the recrystallization start temperature of the wire, the wire flow at the time of resin molding can be reduced.
(e) In addition to the second element group, 1 to 50 ppm by weight of at least one member selected from the group consisting of In and Tl (third group), in total, is added. In this way, the length of the recrystallization portion at the heat-affected portions near the ball portion can be increased, and a thin gold-alloy wire having a greater loop height can be obtained.
(f) When the elements of the first, second and third groups are co-present, the thin gold-alloy wire having the effects of addition of these element groups in combination can be obtained. In other words, the wire does not come into contact with the Si chip in elongated wiring, and since the loop bend and the wire flow at the time of resin molding can be reduced, high density packaging having small gaps between adjacent wirings can be accomplished.

In other words, the present invention is completed on the finding described above, and has the following construction as the gist thereof.
(1) A thin gold-alloy wiring for a semiconductor device, used at a high temperature, containing 50 to 3000 ppm, particularly 50 to 100 ppm, by weight of Mn with the balance comprising gold and unavoidable impurities.
(2) A thin gold-alloy wire for a semiconductor device containing 1 to 20 ppm by weight of at least one member selected from the group consisting of Be and B, in total, in addition to the components of the item (1) described above.
(3) A thin gold-alloy wire for a semiconductor device further containing 1 to 30 ppm by weight of at least one member selected from the group consisting of Ca, Sr and rare earth elements, in total, in addition to the components of the item (1).
(4) A thin gold-alloy wire for a semiconductor device further containing 1 to 30 ppm by weight of at least one member selected from the group consisting of Ca, Sr and rare earth elements (Y is contained in said elements), in total, in addition to the components of the item (2).
(5) A thin gold-alloy wire for a semiconductor device further containing 1 to 50 ppm by weight of at least one member selected from the group consisting of In and Tl, in total, in addition to the components of the item (3).
(6) A thin gold-alloy wire for a semiconductor device further containing 1 to 50 ppm by weight of at least one member selected from the group consisting of In and Tl, in total, in addition to the components of the item (4).

BEST MODE FOR CARRYING OUT THE INVENTION

Figure 1:
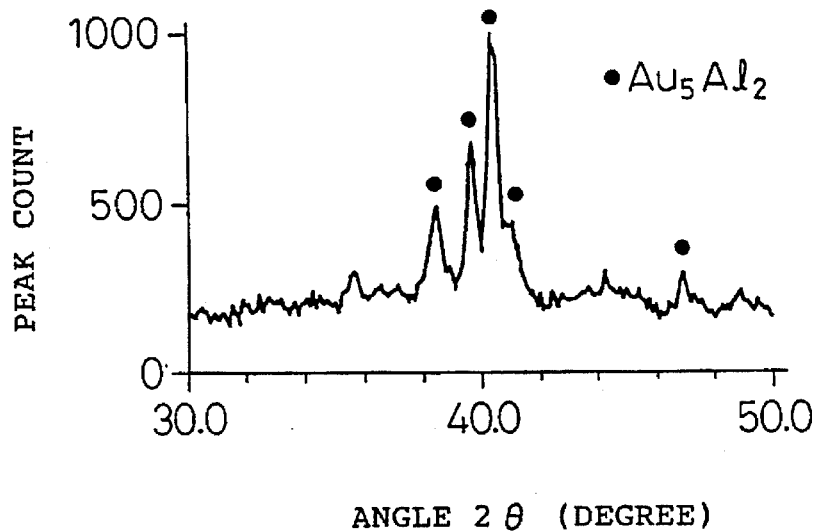
FIG. 1 is a graph showing a result obtained by X-ray diffraction of the thin wire of the present invention (in this wire, 1000% by weight of Mn is added to Au) obtained when this wire is annealed at a temperature of 200° C. for 300 hrs.
Figure 2:
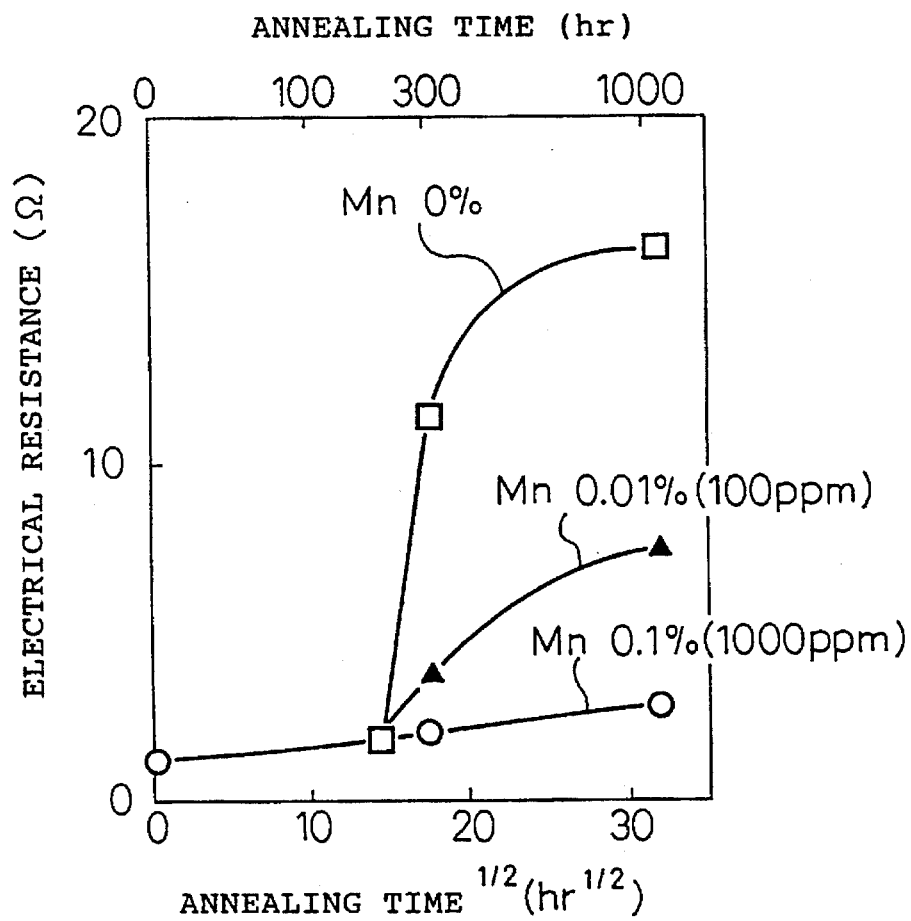
FIG. 2 is a graph showing relationship Mn content, annealing time and electric resistance.

Hereinafter, the best mode for carrying out the present invention will be explained.

High purity gold used in the present invention contains gold having a purity of at least 99.995 wt %, and the balance comprises unavoidable impurities.

When a gold ball joint portion is exposed to a high temperature environment, several kinds of intermetallic compounds grow with the mutual diffusion of gold and aluminum on the bonding interface, and a specific compound phase, i.e., $Au_4Al$ phase, readily reacts with a halogen element in a molding resin and results in the increase of the electrical resistance at the joint portion.

Addition of manganese (Mn) is extremely effective to eliminate such a cause. In other words, when manganese is added to gold, Mn suppresses the growth of the compound phase which is enriched due to the diffusion inside gold in the proximity of the interface and is corroded, and also suppresses the rise of the electrical resistance of the joint portion left standing at a high temperature. The Mn content is stipulated to be 50 to 3000 ppm by weight for the following reasons. If the Mn content is less than 50 ppm by weight, the effect of suppressing corrosion of the intermetallic compounds at the joint portion in the above high temperature range is small, and if it exceeds 3000 ppm by weight, during the gold ball is formed, oxide films are formed on the surface of ball, so that bondability of the ball, i.e., shear strength, should be reduced. Especially if the amount of Mn is less than 100 ppm by weight, sphericity of the ball portion formed at the distal end of the wire can be improved, so that the formation of a desired ball having a small diameter to cope with a smaller pitch between electrodes on a semiconductor device becomes preferable. The effect of improving reliability can be sufficiently obtained when the Mn content is within the range described above.

Mn has a large solid solubility into gold and has small influences on mechanical strength. when the amount of Mn is added as described above, it is not possible to obtain the effect of controlling a loop shape. For this reason, the present invention further improves the basic characteristics of the wire by allowing elements other than Mn to be co-present, and contemplates to cope with diversified needs for wire characteristics. It has been advantageously confirmed that the above amount of Mn hardly exerts any adverse influences on the characteristics brought forth by other elements.

Be and B are added as the elements of the first group so as to improve the normal temperature strength of the wire, to facilitate a wire drawing step and thus to make it easier to industrially produce the Mn-containing thin gold-alloy wire. The improvement of the breaking strength can be hardly expected when Mn is added alone. Because work hardening during the drawing process is also small, the increase in the drawing speed of the wire will result in breakage of the wire. When a suitable amount of Be or B is contained, however, work hardening during the drawing process of the wire can be promoted, so that the improvement in producibility as well as a higher speed operation of the drawing process can be achieved. If the amounts of Be and B are less than 1 ppm by weight, the change of the mechanical strength is extremely small and if the amounts exceed 20 ppm by weight, the hardness of the ball portion becomes so high that a sufficient bonding strength cannot be obtained easily, or the semiconductor device might be damaged at the time of bonding. For these reasons, the Be and B contents are limited to the range of 1 to 20 ppm by weight.

When Ca, Sr and rare earth elements are added as the elements of the second group, not only the normal temperature strength of the wire but also its high temperature strength can be increased, so that flow and sag of the wire at the time of the formation of the loop can be reduced. Because the resin heated to a high temperature at the time of resin molding flows into a mold at a high speed while keeping its high viscosity, the connected wire undergoes deformation due to the flow. However, when trace amounts of Ca, Sr and rare earth elements are added, the high temperature strength of the wire can be improved and in consequence, the wire flow can be reduced at the time of resin molding. When crystal grains get coarse by heat-affected portions in the proximity of the ball, damage such as cracks might occur at the neck portion when the loop is formed. However, addition of Ca, Sr and rare earth elements suppress recrystallization at the heat-affected portions, render the crystal grains finer, and thus improve the strength of the neck portion. If the amounts of Ca, Sr an the rare earth elements are less than 1 ppm by weight, the increase of the high temperature strength is small and if the amounts exceed 30 ppm by weight, on the other hand, shrinkage pores are formed at the distal end of the ball, so that the bonding strength after ball bonding drops. Accordingly, the amounts of one or more of Ca, Sr and rare earth elements are limited to the range of 1 to 30 ppm by weight in total.

When the first and second groups are co-present, the bend of the wire after bonding can be reduced due to the improvement of the mechanical strength of the wire, and the wire flow at the time of resin molding can be reduced due to the increase of the high temperature strength and to the improvement in the breaking strength of the neck portion. Therefore, the thin gold-alloy wire becomes suitable for a long span between the bond portions. In order to increase the mechanical strength of the wire so as to cope with elongation described above, the effect of the addition of the second group elements is great. However, when the second group elements are alone added to increase the mechanical strength of the wire, the drop of the bonding strength due to the formation of the shrinkage pores at the distal end of the ball might occur. Accordingly, the improvement in the strength, particularly the breaking strength, is assisted by allowing the first group elements to be co-present, and in this way, elongation can be accomplished without causing the drop of the bonding strength. The amount of one member selected from the group consisting of Be and B is within the range of 1 to 20 ppm by weight in total, and the amount of at least one member selected from the group consisting of Ca, Sr and the rare earth elements is within the range of 1 to 30 ppm by weight in total, for the reasons already described.

It has been found out that when In and Tl as the third group elements are added, the length of the recrystallization portion affected by the thermal influences at the time of the ball formation is increased. The length of the recrystallization portion is the critical factor that governs the loop height, and the distal end portion of recrystallization, that is, the portion at which the mechanical strength remarkably changes, corresponds to the highest loop portion. However, when the third group element or elements are added alone, the mechanical strength of the wire is not sufficient, and variance in the size of the loop becomes great.

Accordingly, the high looping described above is achieved by the third group elements and the mechanical strength of the wire is improved by the second group elements to reduce variance of the loop height by causing the second and third group elements to co-exist. When the amounts of In and Tl are less than 1 ppm by weight, the effect of addition is small and when they exceed 50 ppm by weight, on the other hand, the ball portion does not become a perfect ball and joining of a narrow pitch between the electrodes becomes difficult. Accordingly, the amount of at least one member selected from the group consisting of In and Tl is stipulated to the range of 1 to 50 ppm by weight. The content of Ca, Sr and the rare earth elements is limited to 1 to 30 ppm by weight in total for the same reason as described already.

When the wire is elongated, sag and bend of the wire immediately after bonding and the wire flow at the time of resin molding generally tend to increase. A wire capable of strict loop control is required so as to simultaneously satisfy the requirements for elongation and suppression of sag and bend of the wire. Therefore, the present invention obtains a thin gold-alloy wire having the addition effects of the first, second and third group elements, respectively, by allowing these groups of elements to be co-present. The mechanical strength of the wire is increased by the addition of the second group elements to improve the bend of the loop, and the high temperature strength is effective particularly for suppressing the wire flow at the time of resin molding. When the first group elements are added, the normal temperature strength can be improved, so that a stable loop shape having less variance can be obtained. When the second group elements are added, the strength of the neck portion can be improved and sag can be reduced. Further, when the third group elements are added, high looping can be accomplished, and the wire can easily cope with elongation without causing contact with the Si chip not only immediately after bonding but also at the time of resin molding. Better effects can be obtained when these groups of elements are co-present. Further, since the effect of addition of each element group is fundamentally independent, the content of each element group is stipulated to the range described already.

EXAMPLES

Hereinafter, Examples of the present invention will be explained.

Gold alloys having a chemical composition tabulated in Tables 1 and 3 in which each of the above addition element groups is contained in electrolytic gold having a gold purity of at least about 99.995% by weight, were melted and cast in a ratio frequency vacuum melting furnace at 1200°±20° C. Each of the resulting ingots was rolled and then drawn at normal temperature. A thin gold-alloy wire had a final wire diameter of 25 μm. The wire was continuously annealed at 200° to 500° C. in the atmosphere and was adjusted so that the elongation value attained was about 4%.

The ball shape, the degree of breakage of the wire during the drawing step, the mechanical properties of the wire, the bonding strength, the loop height, the wire bend, the wire flow after molding and the degree of corrosion of the intermetallic compounds at the ball joint portion, were examined for each of the resulting thin gold-alloy wires, and the results were also tabulated in Table 1.

The degree of breakage of wires in the drawing step was examined by counting the number of times of breakage when a 2 kg ingot of the gold alloy adjusted to the predetermined composition was drawn from a wire diameter of 500 μm to the final wire diameter of 25 μm. Symbol ⊙ represents 0, ○ represents 1 to 5 (times) and Δ represents five or more times.

The mechanical characteristics of the wire examined in the following way. The tensile breaking strength at normal temperature was measured using a thin gold-alloy wire having a wire diameter of 25 μm, and the breaking test when the wire was held for about 20 seconds inside a vertical furnace at 250° C., that is, the high temperature strength, was measured by the tensile test. The difference of the strength at the normal temperature strength and the high temperature strength was used as an index. The mechanical strength of the wire was easily susceptible to the influences of intermediate annealing and greatly changed by refining annealing at the final wire diameter. Further, the loop shape was affected by the difference of mechanical characteristics of the neck portion affected by the thermal influences at the time of the ball formation and the mechanical characteristics of the bus portion, and this characteristic feature could be put into order by utilizing the strength difference between the normal temperature strength and the high temperature strength.

The ball shape of the gold alloy balls, each produced by arc discharge by electric torch using a high speed automatic bonder was observed through a scanning electron microscope. Symbol x represents those ball shapes which had abnormal shapes or in which the occurrence of shrinkage pores was observed at the distal end portion of the ball and could not be bonded satisfactorily to the electrode on the semiconductor device, and symbol Δ represents the ball shapes which a sphericity was low but a joining property was not under the bad-influence and symbol ○ represents a good shape.

The bonding strength was evaluated in the following way. The wire was bonded by the high speed automatic bonder, and a lead frame and a semiconductor device to be measured were fixed to a jig. Then, the center portion of the thin gold-alloy wire after bonding was pulled, and the tensile strength at the time of breakage of the thin wire was evaluated in terms of the mean value of the pull strength measured for 100 wires. The jig was moved in parallel at a position spaced apart by 3 μm on the electrode of the semiconductor device similarly fixed so as to cause shear fracture of the bonded ball, and the load at the time of this fracture was evaluated by the shear strength obtained by measuring 100 wires.

The loop height was measured in the following way. The electrode on the semiconductor device and the external leads were bonded, and the distance between the apex of each loop and the electrode surface of the semiconductor device was measured for 100 wires by an optical microscope, and the loop height as the difference of the height and variance were evaluated.

The wire bend was evaluated in the following way. Each wire, which was bonded in such a manner that the bonding distance (span) between both ends thereof became 2.5 mm, was observed from a substantially upper direction of the semiconductor device, and the distance between a straight line connecting the center portion of the wire to both end bond portions thereof and a vertical line at the portion at which the wire bend was maximum was measured by a projector. The wire bend was expressed by a mean value of eighty wires.

The wire flow after resin molding was measured in the following way. First, wire bonding was made so that a wire span of 4.5 mm could be obtained, and the semiconductor device was then mounted to a lead frame. After this the lead frame was molded into an epoxy resin using a molding apparatus, the inside of this resin molded semiconductor device was X-ray photographed using a soft X-ray non-destructive inspection apparatus. The flow quantity of the portion at which the wire flow was maximum was measured for 80 testpieces in the same way as the measurement of the wire bend, and the quotient (percentage) obtained by dividing the mean value of the flow quantity by the span length was defined as the wire flow after resin molding.

The ball formed at the distal end of the thin gold-alloy wire was bonded to the aluminum electrode, and after being molded by the epoxy resin, the semiconductor device was heat-treated at 200° C. for 300 hours in a nitrogen gas. The semiconductor device was then vertically polished to a section passing through the center of the ball bonding portion, and corrosion of the layer of gold and the aluminum intermetallic compound grown on the bonding interface was observed. The intermetallic compound layer was gray in color. Since the compound layer which was corroded was brown, it could be easily distinguished. The progress of corrosion of the intermetallic compound at the ball bonding portion was examined by utilizing the feature described above. The progress of corrosion was examined by the proportion of the length (b) of the corrosion region in the length (a) of the growth of the intermetallic compound layer on the polished section of the ball bonding portion. Symbol ○ represents remarkable suppression of corrosion when the mean value of 30 ball bonding portions had a proportion (a/b) of up to 5% of the corrosion portion. Symbol x represents remarkable corrosion when the mean value was not smaller than 40%, and A represents the testpieces having the proportion (a/b) between 5 and 40%.

Tables 1 to 4 illustrate the evaluation result of the thin gold-alloy wires produced by using the constituent components of the present invention, and Tables 5 and 6 illustrate the evaluation results of the thin gold-alloy wires having the addition amounts outside the range of the present invention.

As shown in Table 2 and Table 4, corrosion of the compound layer at the bond portion is restricted by the addition of Mn, and long-term reliability can be improved. On the other hand, when Mn is added in an amount less than the amount of the range of the present invention as represented by Comparative Examples 1 to 3, the effect of suppression of corrosion is small. In Comparative Examples 6 and 7 wherein Mn was added in a greater amount than the range of the present invention, the shape of the ball was not desirable.

As to the evaluation of the ball shape, the components within the range of the present invention could form the normal balls (see Tables 2 and 4) in all cases, but when the components of Table 5 were used in greater amounts than the range of the present invention, some balls failed to have perfect sphericity in some cases and shrinkage pores occurred at the tip of the ball in other cases.

It is believed that there is no problem if the shear strength is at least 50 gf in the case of 25 μm thin gold-alloy wires. The thin wires in Table 2 and Table 4 all satisfied the value of at least 50 gf, but some of the wires in Table 6 had a value less than 50 gf, and this value was insufficient for the thin gold-alloy wire for wire bonding.

When the wires were observed after the pull test, all the kinds of thin gold-alloy wires were broken at the neck portion immediately above the ball. It could be thus understood that the pull strength was a value reflecting the neck strength and the neck strength was improved in the thin gold-alloy wires to which a suitable amount of the second group elements(s) was added.

Breakage was not observed during the drawing process in the case of the thin gold-alloy wires containing a suitable amount of the first group elements, and in the case of the thin wires containing the other element groups in combination, too, the mechanical strength was improved and drawing was easy.

In the thin gold-alloy wires containing a suitable amount of the second group element(s), the strength difference between the high temperature strength and the normal strength was as small as about 1 gf, the heat-resistance was excellent, and the wire flow after resin molding could be reduced.

The wire bend was generally low and the result was excellent. Among others, the thin gold-alloy wires according to claims 5 and 7 of the present invention exhibited a wire bend which was below the wire diameter, and the linear property of the wire after bonding could be further improved. As to the loop height, the thin gold-alloy wires according to claims 6 and 7 of the present invention had a loop height of not smaller than 200 μm and variance of the loop height, too, could be limited to a low level. Accordingly, a high loop height could be attained easily and stably.

In the thin gold-alloy wires to which a suitable amount of Mn was alone added, the changes of various properties such as the strength and the loop shape were small. It was obvious, however, that more excellent properties could be obtained in the mechanical characteristics and the bonding characteristics by adding each element group according to the present invention. It could be understood from the results tabulated in Table 6, however, that when the amount of addition was out of the range of the lower limit of the constituent components of the present invention, the exhibition effect of the characteristics described above was small, perfect sphericity could not be easily obtained for the ball shape, and the shrinkage pores were formed at the distal end of the ball.

TABLE 1

| Kind of thin wire | Component composition (ppm by weight) | | | | | | | | | | | | |
| --- | --- | --- | --- | --- | --- | --- | --- | --- | --- | --- | --- | --- | --- |
| | Mn | Be | B | Ca | Sr | Y | La | Ce | Nd | Dy | In | Tl | Au, impurity |
| Thin gold-alloy wire of this invention | | | | | | | | | | | | | |
| 1 | 55 | — | — | — | — | — | — | — | — | — | — | — | balance |
| 2 | 70 | — | — | — | — | — | — | — | — | — | — | — | " |
| 3 | 98 | — | — | — | — | — | — | — | — | — | — | — | " |
| 4 | 130 | — | — | — | — | — | — | — | — | — | — | — | " |
| 5 | 200 | — | — | — | — | — | — | — | — | — | — | — | " |
| 6 | 1000 | — | — | — | — | — | — | — | — | — | — | — | " |
| 7 | 2950 | — | — | — | — | — | — | — | — | — | — | — | " |
| 8 | 70 | 2 | — | — | — | — | — | — | — | — | — | — | " |
| 9 | 70 | 18 | — | — | — | — | — | — | — | — | — | — | " |
| 10 | 70 | — | 3 | — | — | — | — | — | — | — | — | — | " |
| 11 | 70 | — | 17 | — | — | — | — | — | — | — | — | — | " |
| 12 | 70 | 8 | 8 | — | — | — | — | — | — | — | — | — | " |
| 13 | 70 | — | — | 3 | — | — | — | — | — | — | — | — | " |

TABLE 1-continued

| Kind of thin wire | Component composition (ppm by weight) | | | | | | | | | | | | |
|---|---|---|---|---|---|---|---|---|---|---|---|---|---|
| | Mn | Be | B | Ca | Sr | Y | La | Ce | Nd | Dy | In | Tl | Au, impurity |
| 14 | 70 | — | — | 27 | — | — | — | — | — | — | — | — | " |
| 15 | 70 | — | — | — | 5 | — | — | — | — | — | — | — | " |
| 16 | 70 | — | — | — | 25 | — | — | — | — | — | — | — | " |
| 17 | 70 | — | — | — | — | 4 | — | — | — | — | — | — | " |
| 18 | 70 | — | — | — | — | 29 | — | — | — | — | — | — | " |
| 19 | 70 | — | — | — | — | — | 3 | — | — | — | — | — | " |
| 20 | 70 | — | — | — | — | — | 27 | — | — | — | — | — | " |
| 21 | 70 | — | — | — | — | — | — | 2 | — | — | — | — | " |
| 22 | 70 | — | — | — | — | — | — | 28 | — | — | — | — | " |
| 23 | 70 | — | — | — | — | — | — | — | 3 | — | — | — | " |
| 24 | 70 | — | — | — | — | — | — | — | 27 | — | — | — | " |
| 25 | 200 | 18 | — | — | — | — | — | — | — | — | — | — | " |
| 26 | 500 | — | — | — | — | — | 27 | — | — | — | — | — | " |
| 27 | 1000 | — | — | — | 15 | — | — | — | — | — | — | — | " |

TABLE 2

| Kind of thin wire | Degree of breakage | | Wire bend (μm) | Wire strength difference (gf) | Shear strength (gf) | Pull strength (gf) | Loop height (μm) | | Wire flow after molding (%) | Corrosion of compound |
|---|---|---|---|---|---|---|---|---|---|---|
| | Ball shape | during drawing | | | | | Mean value | σ | | |
| Thin gold-alloy wire of this invention | | | | | | | | | | |
| 1 | ○ | ○ | 36.5 | 3.8 | 70.4 | 5.8 | 171.3 | 6.6 | 4.8 | ○ |
| 2 | ○ | ○ | 34.3 | 3.7 | 72.5 | 5.8 | 175.5 | 6.2 | 4.7 | ○ |
| 3 | ○ | ○ | 33.6 | 3.7 | 73.5 | 6.1 | 176.5 | 5.5 | 4.7 | ○ |
| 4 | Δ | ○ | 33.5 | 3.6 | 71.1 | 6.1 | 178.3 | 5.5 | 4.6 | ○ |
| 5 | Δ | ○ | 32.1 | 3.6 | 72.5 | 6.2 | 177.2 | 5.5 | 4.4 | ○ |
| 6 | Δ | ○ | 33.1 | 3.8 | 74.5 | 6.3 | 177.5 | 5.5 | 5.1 | ○ |
| 7 | Δ | ○ | 32.9 | 3.9 | 73.2 | 6.5 | 180.2 | 5.3 | 5.2 | ○ |
| 8 | ○ | ⊙ | 30.3 | 2.9 | 75.4 | 6.0 | 174.5 | 5.3 | 4.4 | ○ |
| 9 | ○ | ⊙ | 26.5 | 2.6 | 69.2 | 6.2 | 183.3 | 5.1 | 4.6 | ○ |
| 10 | ○ | ⊙ | 29.4 | 3.0 | 77.3 | 5.8 | 172.6 | 5.2 | 4.5 | ○ |
| 11 | ○ | ⊙ | 28.8 | 2.5 | 67.8 | 6.0 | 179.7 | 5.5 | 4.1 | ○ |
| 12 | ○ | ⊙ | 29.9 | 2.6 | 70.5 | 6.3 | 178.9 | 4.5 | 4.2 | ○ |
| 13 | ○ | ○ | 31.2 | 1.4 | 74.5 | 7.0 | 185.4 | 5.1 | 4.4 | ○ |
| 14 | ○ | ○ | 29.4 | 0.7 | 64.3 | 7.8 | 178.3 | 4.6 | 3.6 | ○ |
| 15 | ○ | ○ | 33.4 | 1.5 | 72.3 | 6.5 | 184.7 | 5.3 | 4.5 | ○ |
| 16 | ○ | ○ | 26.5 | 0.9 | 68.9 | 7.6 | 180.5 | 4.1 | 3.9 | ○ |
| 17 | ○ | ○ | 29.6 | 1.7 | 71.9 | 6.5 | 183.2 | 4.9 | 4.5 | ○ |
| 18 | ○ | ○ | 27.7 | 1.0 | 69.5 | 7.4 | 181.8 | 4.5 | 4.1 | ○ |
| 19 | ○ | ○ | 31.0 | 1.8 | 73.2 | 6.9 | 184.3 | 5.4 | 4.7 | ○ |
| 20 | ○ | ○ | 28.7 | 1.2 | 71.4 | 7.7 | 180.5 | 5.0 | 4.0 | ○ |
| 21 | ○ | ○ | 29.8 | 1.6 | 74.1 | 6.6 | 181.2 | 5.0 | 4.6 | ○ |
| 22 | ○ | ○ | 24.3 | 0.9 | 69.5 | 7.6 | 178.9 | 4.9 | 3.8 | ○ |
| 23 | ○ | ○ | 28.9 | 1.5 | 75.6 | 6.3 | 179.5 | 4.8 | 4.5 | ○ |
| 24 | ○ | ○ | 26.5 | 1.0 | 70.3 | 7.4 | 178.5 | 4.5 | 3.9 | ○ |
| 25 | ○ | ⊙ | 26.6 | 2.8 | 71.2 | 6.1 | 184.2 | 5.2 | 4.8 | ○ |
| 26 | ○ | ○ | 28.9 | 1.3 | 72.4 | 7.5 | 182.5 | 5.0 | 4.0 | ○ |
| 27 | ○ | ○ | 26.4 | 0.9 | 69.2 | 7.8 | 186.2 | 4.2 | 3.9 | ○ |

TABLE 3

| Kind of thin wire | Component composition (ppm by weight) | | | | | | | | | | | | |
|---|---|---|---|---|---|---|---|---|---|---|---|---|---|
| | Mn | Be | B | Ca | Sr | Y | La | Ce | Nd | Dy | In | Tl | Au, impurities |
| Thin gold-alloy wire of this invention | | | | | | | | | | | | | |
| 28 | 70 | — | — | — | — | — | — | — | — | 3 | — | — | balance |
| 29 | 70 | — | — | — | — | — | — | — | — | 27 | — | — | " |
| 30 | 70 | — | — | 15 | 8 | — | — | — | — | — | — | — | " |
| 31 | 70 | — | — | 5 | — | 5 | 7 | — | — | — | — | — | " |
| 32 | 70 | — | — | 5 | — | — | 7 | 7 | — | 7 | — | — | " |
| 33 | 70 | — | — | — | 8 | — | — | — | 5 | 7 | — | — | " |
| 34 | 70 | 5 | — | 8 | 8 | — | — | — | — | — | — | — | " |
| 35 | 70 | 10 | — | — | — | 15 | 7 | — | — | — | — | — | " |
| 36 | 70 | 5 | — | — | — | — | — | 7 | 7 | 5 | — | — | " |
| 37 | 70 | — | 10 | 5 | — | 5 | — | 5 | — | 5 | — | — | " |
| 38 | 70 | — | — | 15 | 8 | — | — | — | — | — | 3 | — | " |
| 39 | 70 | — | — | — | 8 | — | 12 | — | — | — | 27 | — | " |
| 40 | 70 | — | — | 15 | — | — | — | 8 | — | — | — | 4 | " |
| 41 | 70 | — | — | — | — | 10 | — | 8 | — | 8 | — | 28 | " |
| 42 | 70 | — | — | 5 | 8 | — | — | — | — | — | 10 | 10 | " |
| 43 | 70 | 10 | — | 15 | 8 | — | — | — | — | — | 15 | — | " |
| 44 | 70 | 10 | — | 5 | — | 5 | 7 | — | — | — | 15 | — | " |
| 45 | 70 | 10 | — | — | — | — | — | 7 | 7 | 5 | — | 15 | " |
| 46 | 70 | — | 10 | 15 | 8 | — | 7 | — | — | — | 15 | — | " |
| 47 | 70 | — | 10 | — | — | 5 | 5 | 7 | — | 5 | — | 15 | " |
| 48 | 200 | 10 | — | — | — | 15 | 7 | — | — | — | — | — | " |
| 49 | 500 | — | — | 5 | 9 | — | — | — | — | — | 10 | 10 | " |
| 50 | 1000 | 11 | — | — | — | — | — | 6 | 8 | 5 | — | 15 | " |

TABLE 4

| Kind of thin wire | Ball shape | Degree of breakage during elongation | Wire bend (μm) | Wire strength difference (gf) | Shear strength (gf) | Pull strength (gf) | Loop height (μm) | | Wire flow after molding (%) | Corrosion of compound |
|---|---|---|---|---|---|---|---|---|---|---|
| | | | | | | | Mean value | σ | | |
| Thin gold-alloy wire of this invention | | | | | | | | | | |
| 28 | ○ | ○ | 32.1 | 1.8 | 74.3 | 6.1 | 174.2 | 4.7 | 4.6 | ○ |
| 29 | ○ | ○ | 30.8 | 1.0 | 71.5 | 7.5 | 178.5 | 4.5 | 3.8 | ○ |
| 30 | ○ | ○ | 25.5 | 0.8 | 70.6 | 7.7 | 175.6 | 4.9 | 3.6 | ○ |
| 31 | ○ | ○ | 28.2 | 1.1 | 68.4 | 7.6 | 173.2 | 4.5 | 3.4 | ○ |
| 32 | ○ | ○ | 28.7 | 0.8 | 67.5 | 7.4 | 178.2 | 4.6 | 3.5 | ○ |
| 33 | ○ | ○ | 29.4 | 0.9 | 64.3 | 7.7 | 175.6 | 4.4 | 3.7 | ○ |
| 34 | ○ | ◉ | 13.0 | 1.3 | 66.5 | 8.1 | 178.2 | 4.7 | 2.9 | ○ |
| 35 | ○ | ◉ | 15.2 | 1.2 | 68.5 | 8.4 | 178.9 | 4.5 | 2.7 | ○ |
| 36 | ○ | ◉ | 16.5 | 1.1 | 69.4 | 8.1 | 176.9 | 4.8 | 2.8 | ○ |
| 37 | ○ | ◉ | 14.3 | 0.9 | 71.3 | 8.2 | 177.5 | 4.2 | 2.6 | ○ |
| 38 | ○ | ○ | 24.1 | 1.1 | 72.4 | 7.7 | 193.4 | 3.2 | 4.0 | ○ |
| 39 | ○ | ○ | 28.3 | 1.2 | 73.2 | 7.8 | 202.3 | 3.3 | 4.1 | ○ |
| 40 | ○ | ○ | 21.2 | 1.1 | 69.4 | 7.6 | 186.2 | 3.1 | 4.4 | ○ |
| 41 | ○ | ○ | 20.5 | 0.9 | 71.5 | 7.8 | 205.6 | 3.6 | 4.4 | ○ |
| 42 | ○ | ○ | 22.3 | 1.1 | 70.2 | 8.0 | 200.4 | 3.4 | 4.3 | ○ |
| 43 | ○ | ◉ | 11.8 | 0.9 | 88.5 | 8.5 | 205.4 | 3.0 | 2.6 | ○ |
| 44 | ○ | ◉ | 12.4 | 1.1 | 74.3 | 8.6 | 207.3 | 2.8 | 2.5 | ○ |
| 45 | ○ | ◉ | 10.6 | 1.0 | 74.3 | 8.6 | 203.4 | 3.1 | 2.7 | ○ |
| 46 | ○ | ◉ | 10.1 | 0.7 | 69.8 | 8.8 | 209.2 | 2.9 | 2.4 | ○ |
| 47 | ○ | ◉ | 10.5 | 1.0 | 71.2 | 8.7 | 203.8 | 3.0 | 2.4 | ○ |
| 48 | ○ | ◉ | 15.3 | 1.2 | 69.2 | 8.6 | 178.9 | 4.8 | 2.6 | ○ |
| 49 | ○ | ○ | 22.4 | 1.2 | 71.2 | 8.0 | 205.2 | 3.2 | 4.2 | ○ |
| 50 | ○ | ◉ | 10.2 | 1.0 | 75.1 | 8.7 | 213.4 | 3.3 | 2.5 | ○ |

TABLE 5

| Kind of thin wire | Component composition (ppm by weight) | | | | | | | | | | | | |
|---|---|---|---|---|---|---|---|---|---|---|---|---|---|
| | Mn | Be | B | Ca | Sr | Y | La | Ce | Nd | Dy | In | Tl | Au, impurities |
| Comparative Examples | | | | | | | | | | | | | |
| 1 | 0.5 | — | — | — | — | — | — | — | — | — | — | — | balance |
| 2 | 20 | — | — | — | — | — | — | — | — | — | — | — | " |
| 3 | 45 | — | — | — | — | — | — | — | — | — | — | — | " |
| 4 | 130 | — | — | — | — | — | — | — | — | — | — | — | " |
| 5 | 200 | — | — | — | — | — | — | — | — | — | — | — | " |
| 6 | 3100 | — | — | — | — | — | — | — | — | — | — | — | " |
| 7 | 5000 | — | — | — | — | — | — | — | — | — | — | — | " |
| 8 | 70 | 0.3 | 0.3 | — | — | — | — | — | — | — | — | — | " |
| 9 | 70 | — | — | 0.2 | — | 0.2 | — | 0.2 | — | — | — | — | " |
| 10 | 70 | — | — | — | 0.2 | — | 0.2 | — | 0.2 | 0.2 | — | — | " |
| 11 | 70 | — | — | — | — | — | — | — | — | — | 15 | 15 | " |
| 12 | 70 | 25 | — | — | — | — | — | — | — | — | — | — | " |
| 13 | 70 | — | 27 | — | — | — | — | — | — | — | — | — | " |
| 14 | 70 | — | — | 33 | — | — | — | — | — | — | — | — | " |
| 15 | 70 | — | — | — | — | 35 | — | — | — | — | — | — | " |
| 16 | 70 | — | — | — | — | — | — | — | 35 | — | — | — | " |
| 17 | 70 | — | — | 20 | 10 | — | 10 | — | — | — | — | — | " |
| 18 | 70 | — | — | — | — | 10 | — | 20 | — | 10 | — | — | " |
| 19 | 70 | 20 | — | 5 | 5 | 5 | 5 | 5 | 5 | 5 | — | — | " |
| 20 | 70 | 25 | — | 10 | 10 | 10 | 10 | 10 | — | — | — | — | " |
| 21 | 70 | — | — | 5 | 5 | 5 | 5 | — | — | — | 55 | — | " |
| 22 | 70 | — | — | 5 | — | — | — | 5 | 5 | 5 | 55 | — | " |
| 23 | 70 | — | — | 5 | 5 | 5 | 5 | — | — | — | — | 55 | " |
| 24 | 70 | 20 | 20 | 7 | 7 | 7 | 7 | 7 | 7 | 7 | 30 | 30 | " |

TABLE 6

| Kind of thin wire | Ball shape | Degree of breakage during drawing | Wire bend (μm) | Wire strength difference (gf) | Shear strength (gf) | Pull strength (gf) | Loop height (μm) Mean value | σ | Wire flow after molding (%) | Corrosion of compound |
|---|---|---|---|---|---|---|---|---|---|---|
| Comparative Examples | | | | | | | | | | |
| 1 | ○ | ○ | 45.4 | 3.9 | 73.5 | 5.1 | 166.3 | 7.4 | 5.2 | × |
| 2 | ○ | ○ | 40.1 | 3.8 | 74.4 | 5.4 | 166.8 | 6.4 | 4.6 | Δ |
| 3 | ○ | ○ | 38.0 | 3.5 | 72.3 | 5.6 | 169.4 | 6.0 | 4.7 | Δ |
| 4 | Δ | ○ | 33.5 | 3.6 | 71.1 | 6.1 | 178.3 | 5.5 | 4.6 | ○ |
| 5 | Δ | ○ | 32.1 | 3.6 | 72.5 | 6.2 | 177.2 | 5.5 | 4.4 | ○ |
| 6 | Δ | ○ | 30.5 | 3.5 | 57.5 | 6.8 | 180.5 | 5.5 | 4.2 | ○ |
| 7 | Δ | ○ | 30.0 | 3.3 | 51.0 | 7.0 | 180.4 | 6.0 | 4.0 | ○ |
| 8 | ○ | ○ | 33.1 | 3.3 | 75.0 | 5.9 | 173.0 | 5.6 | 4.4 | ○ |
| 9 | ○ | ○ | 32.8 | 2.0 | 74.3 | 6.0 | 172.8 | 5.7 | 4.2 | ○ |
| 10 | ○ | ○ | 33.6 | 2.0 | 73.6 | 5.9 | 174.0 | 5.5 | 4.3 | ○ |
| 11 | ○ | ○ | 33.9 | 2.6 | 72.8 | 6.3 | 196.4 | 9.0 | 4.5 | ○ |
| 12 | Δ | ◎ | 29.0 | 2.3 | 56.4 | 6.4 | 180.0 | 6.0 | 5.0 | ○ |
| 13 | Δ | ◎ | 30.1 | 2.5 | 59.2 | 6.6 | 183.4 | 5.8 | 4.4 | ○ |
| 14 | Δ | ○ | 25.4 | 0.8 | 50.8 | 8.1 | 181.6 | 5.6 | 3.1 | ○ |
| 15 | Δ | ○ | 26.2 | 0.8 | 52.4 | 7.7 | 182.1 | 5.4 | 3.3 | ○ |
| 16 | Δ | ○ | 25.6 | 0.9 | 53.5 | 7.8 | 183.1 | 5.5 | 3.4 | ○ |
| 17 | Δ | ○ | 23.8 | 0.7 | 51.5 | 8.2 | 182.3 | 5.3 | 3.4 | ○ |
| 18 | Δ | ○ | 23.2 | 0.7 | 55.1 | 8.1 | 183.5 | 5.2 | 3.3 | ○ |
| 19 | Δ | ◎ | 13.2 | 0.9 | 63.5 | 8.5 | 184.5 | 5.5 | 2.8 | ○ |
| 20 | Δ | ◎ | 12.1 | 0.6 | 49.0 | 9.0 | 184.8 | 5.6 | 2.4 | ○ |
| 21 | Δ | ○ | 22.2 | 1.2 | 52.0 | 8.2 | 215.6 | 3.3 | 3.4 | ○ |
| 22 | Δ | ○ | 21.9 | 1.0 | 50.9 | 8.4 | 221.4 | 3.0 | 3.3 | ○ |
| 23 | Δ | ○ | 20.9 | 1.1 | 51.5 | 8.5 | 218.3 | 3.3 | 3.2 | ○ |
| 24 | Δ | ◎ | 9.9 | 0.7 | 46.5 | 9.5 | 231.4 | 5.0 | 2.0 | ○ |

[Industrial Applicability]

When the thin gold-alloy wire according to the present invention is used, corrosion of the intermetallic compound at the bond portion can be suppressed even under the high temperature condition where the thin gold-alloy wire is bonded to the electrode portion on the semiconductor device and is then resin-molded, and high reliability of the bond portion can be obtained in consequence. Because the reduction of the wire bend and the wire flow at the time of resin molding and high looping can be simultaneously accomplished, the present invention can provide the thin gold-alloy wire capable of coping with high density packaging of the semiconductor devices.

We claim:

1. A thin gold-alloy wire for a semiconductor device which comprises:

50 to 3000 ppm by weight of Mn, 1 to 30 ppm by weight in total of at least one member selected from a group consisting of Ca, Sr and rare earth element, 1 to 50 ppm by weight in total of at least one member selected from a group consisting of In and Tl, balance gold and unavoidable impurities.

* * * * *